(12) United States Patent
Baker et al.

(10) Patent No.: US 9,136,710 B1
(45) Date of Patent: Sep. 15, 2015

(54) MULTI-PATH CONVERTERS FOR PV SUBSTRINGS

(75) Inventors: Gary B. Baker, Sherwood, OR (US); Triet Tu Le, Portland, OR (US); Ravindranath Naiknaware, Portland, OR (US)

(73) Assignee: SunPower Corporation, San Jose, CA (US)

( * ) Notice: Subject to any disclaimer, the term of this patent is extended or adjusted under 35 U.S.C. 154(b) by 870 days.

(21) Appl. No.: 13/372,469

(22) Filed: Feb. 13, 2012

Related U.S. Application Data

(60) Provisional application No. 61/450,610, filed on Mar. 8, 2011.

(51) Int. Cl.
*H02J 1/00* (2006.01)
*H02J 3/38* (2006.01)

(52) U.S. Cl.
CPC ..................... *H02J 3/385* (2013.01)

(58) Field of Classification Search
CPC .......... H02J 3/383; H02J 3/385; Y02E 10/58; Y02E 10/50
USPC ........................................................ 307/82
See application file for complete search history.

(56) References Cited

U.S. PATENT DOCUMENTS

| | | | |
|---|---|---|---|
| 6,297,616 B1 * | 10/2001 | Kubo et al. | 320/116 |
| 2009/0160259 A1 | 6/2009 | Naiknaware et al. | |
| 2010/0157632 A1 | 6/2010 | Batten et al. | |
| 2010/0157638 A1 | 6/2010 | Naiknaware et al. | |
| 2010/0207455 A1 * | 8/2010 | Erickson, Jr. et al. | 307/82 |
| 2011/0278926 A1 * | 11/2011 | Phadke | 307/31 |
| 2012/0042588 A1 * | 2/2012 | Erickson, Jr. | 52/173.3 |
| 2012/0249110 A1 * | 10/2012 | Mohr et al. | 323/299 |

OTHER PUBLICATIONS

Hirao, T., "A Modified Modulation Control of a Single-Phase Inverter with Enhanced Power Decoupling for a Photovoltaic AC Module", 2005 European Conference on Power Electronics and Applications, p. 1-10.
Li, Q., "A Review of the Single Phase Photovoltaic Module Integrated Converter Topologies With Three Different DC Link Configurations", May 2008, IEEE Transactions on Power Electronics, pp. 1320-1333, vol. 23, No. 3, IEEE.

(Continued)

*Primary Examiner* — Jared Fureman
*Assistant Examiner* — Duc M Pham
(74) *Attorney, Agent, or Firm* — Boisbrun Hofman, PLLC

(57) ABSTRACT

A method for converting power from a photovoltaic (PV) panel having substrings of PV cells, the method includes converting power from a first substring of the PV panel to generate a first DC output having a fixed portion and a variable portion, converting power from a second substring of the PV panel to generate a second DC output having a fixed portion and a variable portion, and combining the first and second DC outputs to generate a combined DC output. A power converter may include an open-loop switching stage to receive DC power, a transformer having a primary winding coupled to the open-loop switching stage, and first and second secondary windings, a first rectifier bridge coupled to the first secondary winding, a second rectifier bridge coupled to the second secondary winding, and a regulator coupled to the second rectifier bridge.

24 Claims, 6 Drawing Sheets

(56) References Cited

OTHER PUBLICATIONS

Li, Q., "Recent Development in the Topologies for Photovoltaic Module Integrated Converters", Jun. 2006, Power Electronics Specialists Conference, 2006 (PESC '06) 37th IEEE, pp. 1-8, IEEE.

Shinjo, F., "A Single-Phase Grid-Connected Inverter with a Power Decoupling Function", Power Electronics Specialists Conference, 2007. (PESC 2007) IEEE, p. 1245-1249, IEEE.

Shimizu, T., "A Flyback-type Single Phase Utility Interactive Inverter with Low-frequency Ripple Current Reduction on the DC Input for an AC Photovoltaic Module System", 2002, pp. 1483-1488, IEEE.

Kjaer, S.B., "A Review of Single-Phase Grid-Connected Inverters for Photovoltaic Modules", Oct. 2005, IEEE Transactions on Industry Applications, pp. 1292-1306, vol. 41, No. 5, IEEE.

Walker, G.R., "Cascaded DC-DC Converter Connection of Photovoltaic Modules", Jul. 2004, p. 1130-1139, vol. 19 Issue 4, IEEE Transactions on Power Electronics.

* cited by examiner

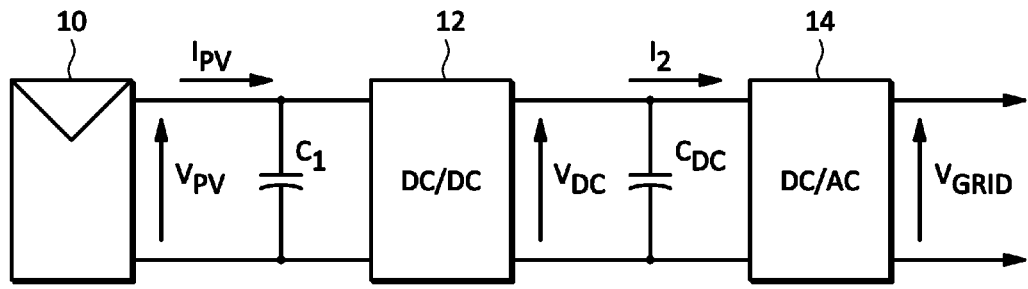
FIG. 1
(PRIOR ART)
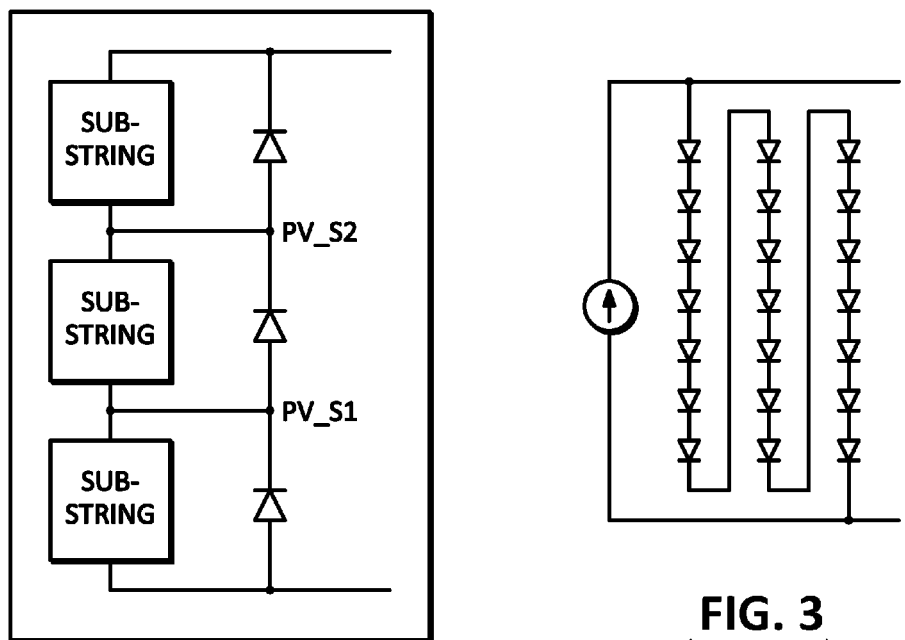
FIG. 2
(PRIOR ART)
FIG. 3
(PRIOR ART)

MULTI-PATH CONVERTERS FOR PV SUBSTRINGS

CROSS-REFERENCE TO RELATED APPLICATIONS

This application claims priority from U.S. Provisional Patent Application Ser. No. 61/450,610 titled Inverter With Leveraged DC Transformer filed Mar. 8, 2011.

BACKGROUND

FIG. 1 illustrates a prior art system for converting DC power from a photovoltaic (PV) panel to AC power. The PV panel 10 generates a DC output current $I_{PV}$ at a typical voltage $V_{PV}$ of about 35 volts. A DC/DC converter 12 boosts $V_{PV}$ to a link voltage $V_{DC}$ of about 420 to 450 volts DC. A DC/AC inverter 14 converts the DC link voltage to an AC output voltage $V_{GRID}$. In this example, the output is assumed to be 240 VAC at 60 Hz to facilitate connection to a local power grid, but other voltages and frequencies may be used.

The system of FIG. 1 also includes a DC link capacitor $C_{DC}$ and a decoupling capacitor $C_1$. Either or both of these capacitors may perform an energy storage function to balance the nominally steady power flow from the PV panel with the fluctuating power requirements of the grid. Power ripple within the system originates at the DC/AC inverter 14, which must necessarily transfer power to the grid in the form of 120 Hz ripple. In the absence of a substantial energy storage device, this current ripple would be transferred all the way back to the PV panel where they would show up as fluctuations (or "ripple") in the panel voltage $V_{PV}$ and/or current $I_{PV}$. Therefore, the DC link capacitor $C_{DC}$ or the decoupling capacitor $C_1$, is used to store enough energy on a cycle-by-cycle basis to reduce the ripple at the PV panel to an acceptable level. In a typical system, the DC link capacitor may operate with a ripple component of about 100 volts peak-to-peak and may use sophisticated algorithms to control the power flow with a sinusoidal grid voltage and corresponding sinusoidal grid current.

The system of FIG. 2 typically includes maximum power point tracking (MPPT) functionality that forces the DC/DC converter to operate at an input voltage and current that maximizes the total amount of power available from the PV panel under its specific operating conditions.

FIG. 1 illustrates the internal structure of a prior art PV module. A typical module includes three substrings of PV cells, internally connected in series and bypassed with diodes. Each substring typically generates a voltage in the range of 10 to 20 volts depending on the amount of sunlight it receives. If a substring becomes shaded, its bypass diode conducts, totally eliminating any power harvest from that substring and reducing the output voltage of the PV module by one-third. FIG. 3 illustrates equivalent circuit of a substring which may be modeled as a current source shunted by numerous diodes connected in series.

A problem with the prior art is that, with the substrings connected in series, the same amount of current must flow through each substring. However, since the substrings may be subjected to different amounts of sunlight due to shading or other conditions, the maximum power point for each substring may require each substring to operate at a different current level. Thus, one or more substrings cannot operate at its maximum power point.

A further problem is that, with three substrings connected in series, each generating power at 10-20 volts, the DC/DC converter must be able to accommodate maximum input voltage of about 70 volts. However, if two substrings are shaded, the minimum operating voltage for the panel may be as low as 10 volts. Thus, the DC/DC converter must be able to accommodate a 10-60 volt input voltage range. Among other problems, this places difficult demands on the DC/DC converter, reduces efficiency, and requires more expensive solid state switches to tolerate the high input voltages.

BRIEF DESCRIPTION OF THE DRAWINGS

FIG. 1 illustrates a prior art system for converting DC power from a photovoltaic panel to AC power.

FIG. 2 illustrates the internal structure of a prior art PV module.

FIG. 3 illustrates equivalent circuit of a substring of a prior art PV module.

DETAILED DESCRIPTION

Figure 4:
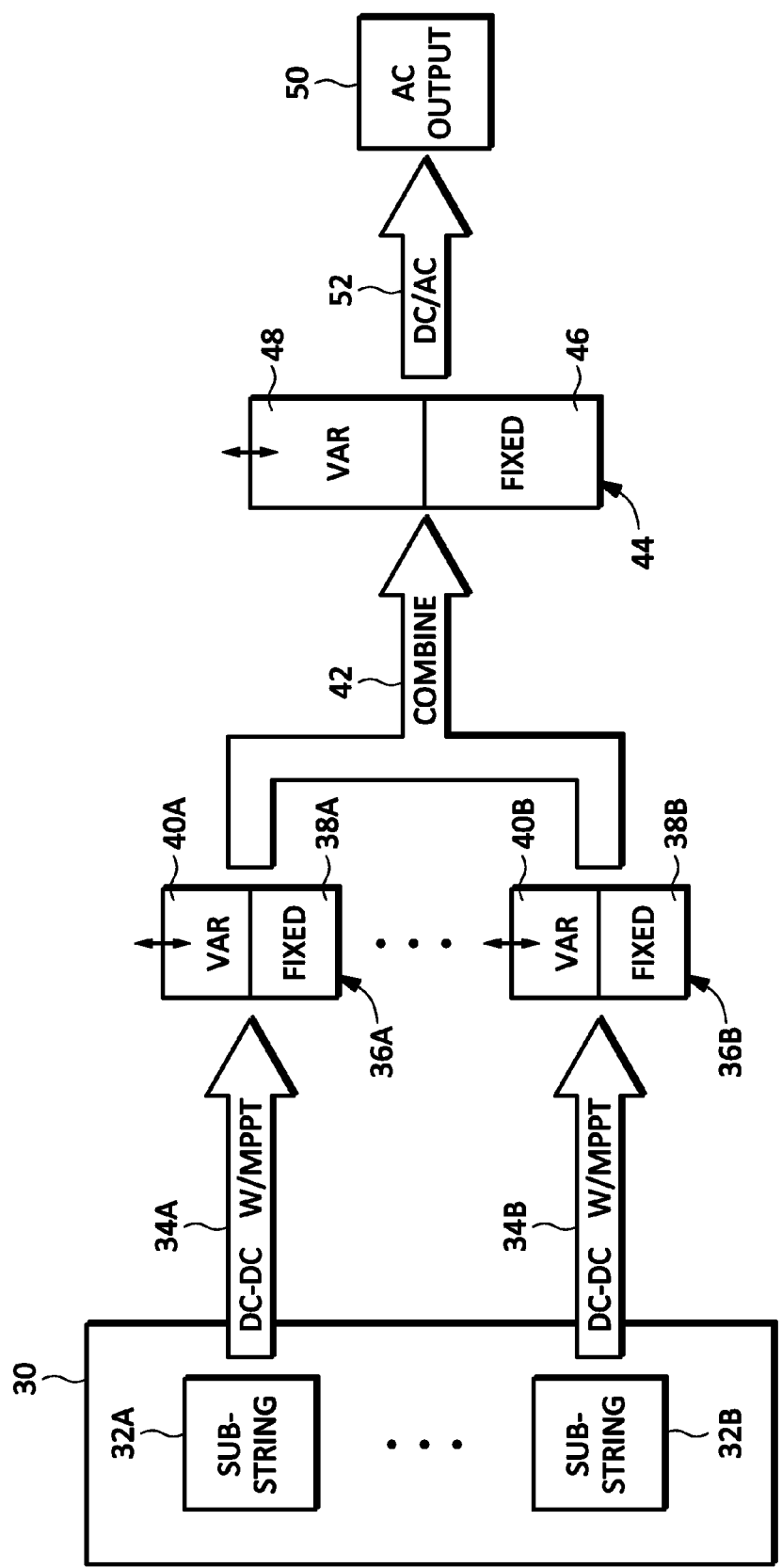
FIG. 4 illustrates an embodiment of a system for converting power from a PV panel having substrings of PV cells according to some inventive principles of this patent disclosure.

FIG. 4 illustrates an embodiment of a system for converting power from a photovoltaic (PV) panel 30 having substrings of PV cells 32A, 32B, etc., according to some inventive principles of this patent disclosure. Power from a first substring 32A of the PV panel is converted using a DC-DC conversion process 34A having multiple sub-processes to generate a first DC output 36A having a fixed portion 38A and a variable portion 40A. Power from a second substring 32B of the PV panel is converted using another DC-DC conversion process 34B having multiple sub-processes to generate a second DC output 36B having a fixed portion 38B and a variable portion 40B. The two DC outputs 36A and 36B are combined through a process 42 to generate a combined DC output 44 having a combined fixed portion 46 and a combined variable portion 48.

The DC-DC conversion process 34A and 34B preferably implement maximum power point tracking (MPPT) for their corresponding substrings. The multiple sub-processes, which generate the fixed and variable portions of the DC outputs, may be any suitable type of DC-DC conversion including voltage boosting, voltage bucking, power inversion, galvanic isolation, rectification, regulation of voltage, current, etc. The fixed and variable portions of the DC outputs may be implemented as fixed and variable portions of the DC output voltage, output current, output power, or any suitable combination of fixed and variable parameters.

Only two substrings and corresponding processes and DC outputs are shown in FIG. 4, but additional substrings and processes may be included as shown by the series of dot marks. The substrings may be completely isolated from each other with each substring having two terminals for extracting power from the substring. Alternatively, the substrings may be connected in series as shown in FIG. 2 with a single power terminal at the node between adjacent substrings.

The two DC outputs 36A and 36B may be combined in series, parallel, series-parallel combination, etc. The combined DC output 44 may optionally be converted to an AC output 50 through any suitable DC-AC conversion process 52.

Figure 5:
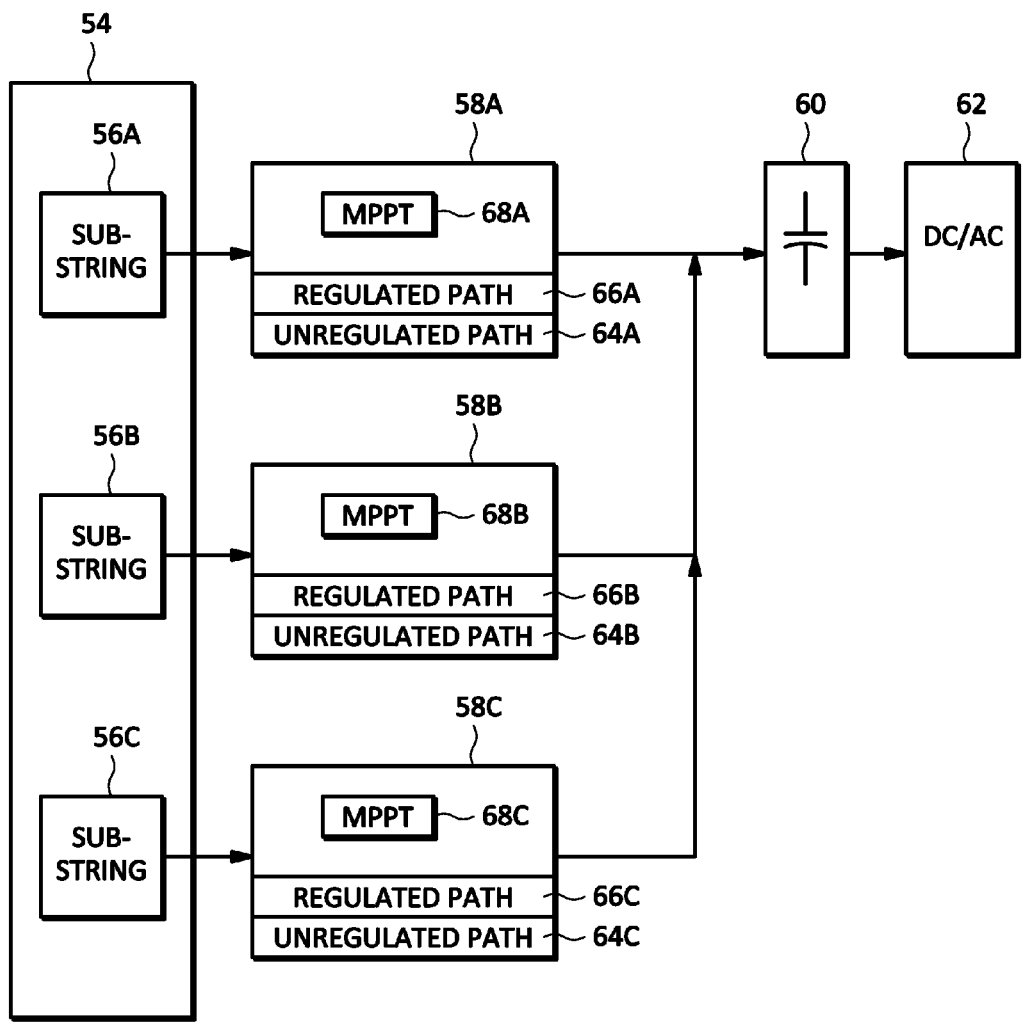
FIG. 5 illustrates another embodiment of a system for converting power from a PV panel having substrings of PV cells according to some inventive principles of this patent disclosure.

FIG. 5 illustrates another embodiment of a system for converting power from a PV panel 54 having substrings of PV cells 56A, 56B and 56C according to some inventive principles of this patent disclosure. A first DC-DC power converter 58A has an input to receive power from the first substring 56A of the PV panel. Second and third DC-DC power converters 58B and 58C have inputs to receive power from the second and third substrings 56B and 56C, respectively. The outputs of the three power converters are combined in series, parallel, series-parallel combination, or any other suitable manner for further processing or use. For example, the combined outputs may be applied to an energy storage device 60 followed by a DC-AC inverter 62.

Each of the DC-DC power converters 58A, 58B and 58C includes an unregulated power path 64A, 64B and 64C and a regulated power path 66A, 66B and 66C, respectively. Each power converter preferably also includes MPPT functionality 68A, 68B and 68C, respectively, to enable each power converter to track the maximum power point of its corresponding substring in the PV panel.

The regulated and unregulated power paths may be implemented with any suitable DC-DC conversion hardware including flyback converters, boost converters, buck converters, switching bridges, rectifier bridges, transformers, etc. A regulated power path may implement, for example, closed-loop regulation of input and/or output voltage, current, power, etc. An unregulated power path may operate, for example, open-loop, with a fixed switching duty cycle, etc.

Although shown as separate paths, there may be overlap between the regulated and unregulated power paths within each power converter and/or between power converters. Examples of overlap between paths include shared input stages, shared output stages, shared transformer cores, etc.

The embodiment of FIG. 5 is illustrated with three substrings and three DC-DC power converters, but the inventive principles may be applied to embodiments with only two or any other number of substrings and corresponding power converters. The substrings may be completely isolated from each other with each sub string having two terminals for extracting power from the substring. Alternatively, the substrings may be connected in series as shown in FIG. 2 with a single power terminal at the node between adjacent substrings. If the substrings are connected in series, the DC-DC power converters 58A, 58B and 58C may need to include some form of input-to-output isolation depending on how their outputs are combined.

An advantage of providing an individual DC-DC power converter for each substring as illustrated above with respect to FIGS. 4 and 5 is that it allows unequal currents to flow through individual strings, thereby providing individual power point tracking at the substring level. Thus, if one or more substrings in a panel are shaded, usable energy may still be harvested from the remaining substrings. A further advantage is that it reduces the input voltage range that each individual power converter must accommodate. For example, with a typical substring having a 10-20 volt operating range, there is only a 50 percent variation in the input voltage range for a substring that is not shaded. This is in contrast to the 10-60 volt input range required for a single power converter to process power from a panel having three-substrings connected in series as discussed above in the Background.

Figure 6:
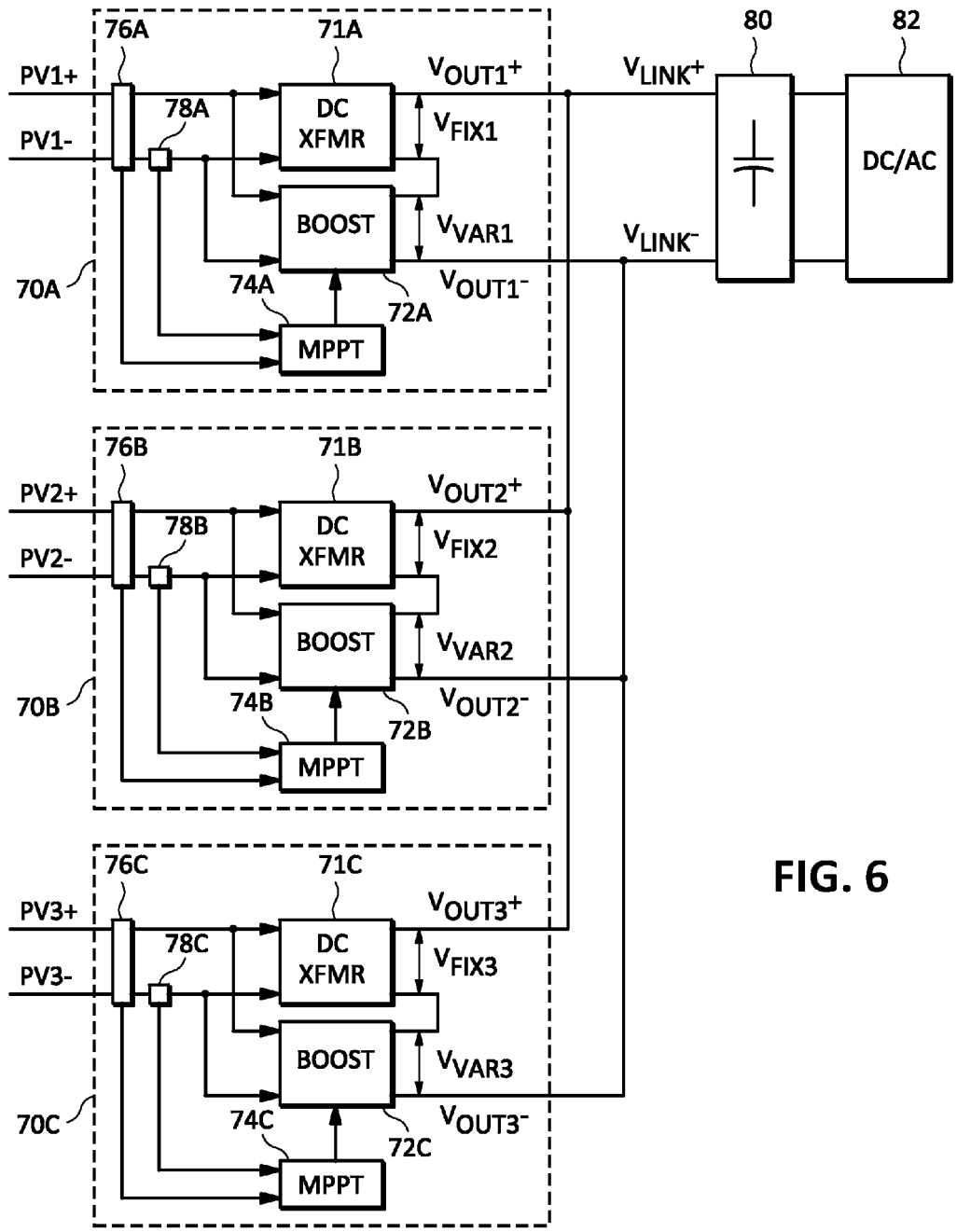
FIG. 6 illustrates an exemplary embodiment of a system for converting power from a PV panel having substrings of PV cells according to some inventive principles of this patent disclosure.

FIG. 6 illustrates an exemplary embodiment of a system for converting power from a PV panel having substrings of PV cells according to some inventive principles of this patent disclosure. The embodiment of FIG. 6 includes three DC-DC converters 70A, 70B and 70C, each having two input terminals PV1±, PV2± and PV3± to receive power from a substring of cells in a PV panel. The outputs terminals $V_{OUT}1\pm$, $V_{OUT2}\pm$ and $V_{OUT3}\pm$ of the converters are connected in parallel to a DC link voltage bus $V_{LINK}\pm$ which is coupled to an energy storage device 80 which may be, for example, a DC link capacitor. The link voltage bus is then applied to an inverter 82 which converts the DC link voltage to an AC output for powering a load, feeding into a utility grid, etc.

The first DC-DC converter 70A includes an unregulated power path 71A which in this embodiment is realized as a transformer isolated DC-DC converter (also referred to as a "DC transformer"). A regulated power path 72A is realized as a boost converter. The inputs of the DC transformer 71A and boost converter 72A are connected in parallel, while their outputs are connected in series to increase the output voltage $V_{OUT}1\pm$.

MPPT functionality 74A controls the regulated power path, i.e., the boost converter 72A, in response to signals received from voltage and current sensors 76A and 78A to optimize the operating point of the corresponding substring. The MPPT functionality may be implemented with analog and/or digital hardware, software, firmware, etc., or any combination thereof. For example, the MPPT functionality may be implemented in a microcontroller that controls the overall operation of the first DC-DC converter 70A.

The construction and operation of the second and third DC-DC converters 70B and 70C are essentially the same as the first converter 70A. The embodiment of FIG. 6 is shown with three DC-DC converters for three substrings, but only two, or any other number of converters may be used.

The transformer isolation in the DC transformer enables the outputs of the DC transformer and boost converter to be connected in series, even though their inputs are in parallel. Whether the boost converter requires transformer isolation depends on whether the substrings are isolated or connected in series. If the substrings are isolated, i.e., have two separate terminals each, the outputs of the three DC-DC converters 70A, 70B and 70C can be connected in parallel even if the boost converters 72A, 72B and 72C do not have input-to-output isolation. However, if the substrings are connected in parallel, the boost converters may need to include galvanic isolation to enable the outputs of the three DC-DC converters 70A, 70B and 70C to be connected in parallel.

An advantage of dividing the power flow from each substring into separate regulated and unregulated power paths is that it may improve the overall efficiency of the power conversion process. An unregulated switching power converter operating at full duty cycle is generally more efficient than a regulated converter with a variable duty cycle. Thus, the more power that is routed through the unregulated power path, the more efficient the overall power conversion process is likely to be.

The percentage of the total power that can be routed through the unregulated path may depend on various factors including the nature of the power processing apparatus downstream from the combined outputs of the DC-DC converters. For example, in the system of FIG. 6, if the energy storage device 80 is implemented with a relatively small polymer capacitor so that the link voltage $V_{LINK}$ is allowed to swing over a relatively wide range, then the system might be designed so that two-thirds of the power is provided by the unregulated power path, and one-third is provided by the regulated power path.

In contrast, if the energy storage device 80 is implemented with a relatively large electrolytic capacitor with a much smaller voltage swing, then a much larger percentage of the total power, perhaps 90-95 percent, may be routed through the unregulated DC transformer path 71A.

Figure 7:
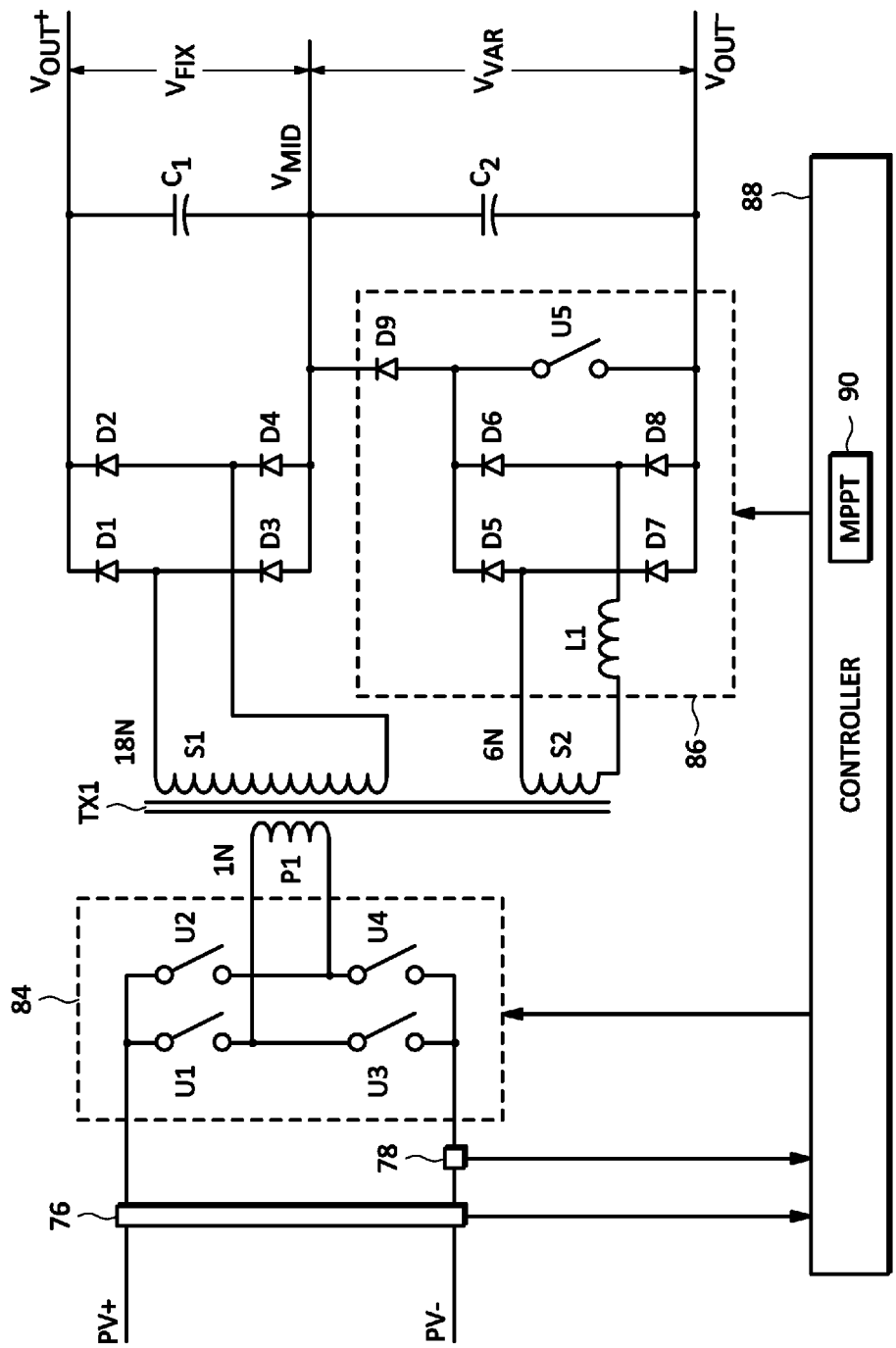
FIG. 7 illustrates an exemplary embodiment of a DC-DC power converter according to some inventive principles of this patent disclosure.

FIG. 7 illustrates an exemplary embodiment of a DC-DC power converter according to some inventive principles of this patent disclosure. The embodiment of FIG. 7 may be used to implement any of the DC-DC power converters 70A, 70B and 70C of FIG. 6, but the inventive principles are not limited to these details or applications.

Power from a substring is received at the input terminals PV± and applied to an open-loop switching stage which in this embodiment is implemented as a full H-bridge 84 including switches U1-U4. The output of the H-bridge is applied to the primary winding P1 of a galvanically isolated transformer TX1 which has two secondary windings S1 and S2. The output of one secondary winding S1 is rectified by a full-wave rectifier bridge made up of diodes D1-D4 and then applied to a filter capacitor C1, thus becoming the fixed portion $V_{FIX}$ of the total output voltage $V_{OUT}$.

The output of the other secondary winding S2 is applied to a boost converter 86 which includes diode bridge D5-D8, inductor L1, switch U5 and diode D9. The output of the boost converter, which operates in a discontinuous conduction mode, appears across filter capacitor C2 as the variable portion $V_{VAR}$ of the total output voltage. Thus, the total output voltage $V_{OUT}$ includes the variable portion $V_{VAR}$ added to the fixed portion $V_{FIX}$.

As mentioned above, two different power paths may overlap in the sense of sharing some components. In this example, the unregulated DC transformer power path and the regulated boost converter path share a common bridge stage, primary winding and transformer core, but may still be conceptualized as separate power paths.

A controller 88 includes monitoring and control circuitry to control the overall operation of the system. Input voltage and current feedback are provided by voltage and current sensors 76 and 78, respectively. The controller provides fixed drive signals at full (50 percent) duty cycle for the switches in the H-bridge 84. The controller includes MPPT logic 90 to drive the switch U5 in the boost converter 86 to provide maximum power point tracking for the substring connected to the input terminals PV±. That is, the controller implements a feedforward control loop that regulates the amount of power drawn from the substring by modulating the duty cycle of the switch U5 in the boost converter. Therefore, the variable output voltage $V_{VAR}$, and thus the total output voltage $V_{OUT}$, is allowed to float to a value that is determined by the downstream apparatus. For example, if the embodiment of FIG. 7 is used to implement each of the DC-DC power converters 70A, 70B and 70C of FIG. 6, the inverter 82 can modulate the amount of power transferred to the load or grid, thereby controlling the link voltage $V_{LINK}$.

The controller 88 may include any suitable isolation for sensing the input voltage and current, and for driving the H-bridge 84 and the boost converter 86. For example, if the controller is referenced to the secondary side of the system at $V_{OUT}$−, it can derive a housekeeping power supply from any suitable node such as VMID, $V_{OUT}$+, etc., and drive the switch U5 in the boost converter directly. In such an arrangement, the controller may need to drive the switches in the H-bridge 84 through isolation devices such as pulse transformers, and sense the input voltage and current through isolated sensors. Alternatively, if the controller is referenced to the primary side of the system at PV−, it may derive a housekeeping power supply, as well as sense the input voltage, through a simple connection to PV+, and sense the input current through a sense resistor in line with PV−. It could also drive the low-side switches U3 and U4 directly. It may then need to drive the high side switches U1 and U2 as well as the switch U5 in the boost converter through isolation devices.

Figure 8:
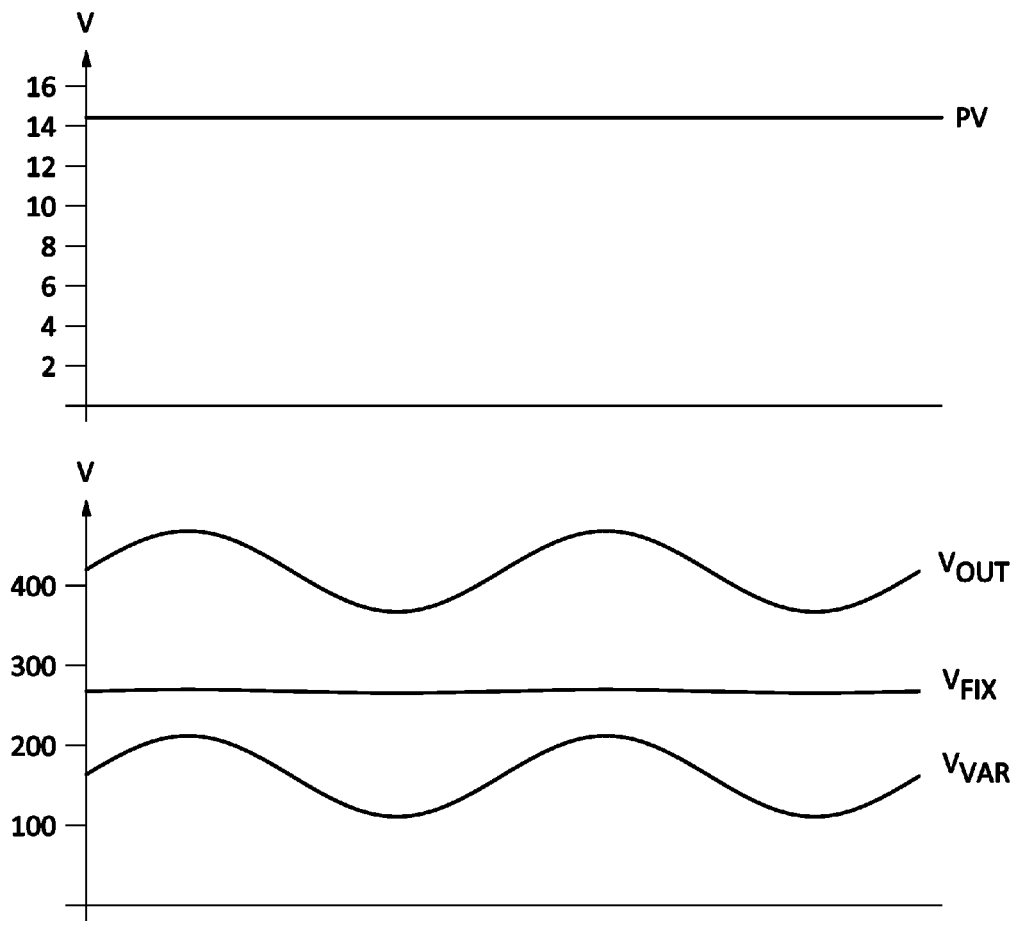
FIG. 8 illustrates some waveforms in the embodiment of FIG. 7.

The turns ratios of the windings on the transformer TX1 may be set to any suitable values. In this example, the primary winding has 1N turns, while the secondary windings S1 and S2 have 18N and 6N turns, respectively. These ratios enable the implementation of a practical realization in which the substrings provide a nominal voltage of 14.4 volts, and a nominal link voltage $V_{LINK}$ of 420 volts with +/−50 volts ripple enables an inverter to generate 240 volt AC power suitable for feeding into a utility grid. For example, in the system of FIG. 6, if the energy storage device 80 is implemented with a relatively small polymer capacitor so that the link voltage $V_{LINK}$ is allowed to swing over a relatively wide range, e.g., a +/−50 volt swing superimposed on a nominal 420 volt nominal voltage as shown in FIG. 8, then with a turns ratio of 1:18:6, two-thirds of the power is provided by the unregulated power path, and one-third is provided by the regulated power path. That is, the output voltage $V_{FIX}1$ of the DC transformer 71A may be a constant value of 260 volts, while the output voltage $V_{VAR}1$ of the boost converter 72A may nominally be 160 volts with a +/−50 volt swing superimposed on it as shown in FIG. 8.

Some potential benefits of the embodiment illustrated with respect to FIGS. 7 and 8, as well as other embodiments described herein are as follows. First, as mentioned above, providing an individual DC-DC power converter for each substring allows unequal currents to flow through individual strings, thereby providing individual power point tracking at the substring level. Thus, if one or more substrings in a panel are shaded, usable energy may still be harvested from the remaining substrings. Moreover, as also discussed above, the use of individual converters with each substring reduces the input voltage range that each individual power converter must accommodate.

Not only does the use of individual converters with each substring reduce the input voltage range, but it also reduces the absolute value of the input voltage. This may be a critical advantage because, with a maximum substring voltage of about 20 volts, power MOSFETS suitable for uses as switches U1-U5 in FIG. 7 are readily available. These switching devices have been developed for high-volume applications in computer system. They are highly reliable, inexpensive, and have very low on-state resistance. Thus, the inventive principles enable technology developed in a completely separate field to be leveraged for use with PV power conversion systems.

A further advantage of the inventive principles is that using an individual DC-DC power converter for each substring results in smaller converters which may therefore enable the use of design and/or manufacturing techniques that may not be scalable to larger system. For example, the transformer TX1 shown in FIG. 7 may be small enough to implement with planar magnetics on a circuit board. In a planar transformer, windings may be formed as conductive traces on a circuit board and connected with vias. A magnetic core is then arranged with legs passing through slots in the circuit board. The use of planar magnetics may enable the creation of reduced height structures that are cost effective and provide excellent manufacturing repeatability. Furthermore, these are suitable for embedding inside a PV module.

Yet another advantage of the embodiment shown in FIG. 7 is that the overlapping portions of the power paths, i.e., the switching bridge, primary winding and transformer core, may further reduce parts count, cost, power losses, etc., while still providing separate regulated and unregulated power paths.

Still another advantage of the inventive principles is that the power converters described herein can easily be integrated directly into a PV panel on which the substrings are mounted.

Although some of the embodiments have been illustrated in context of systems having local inverters for each panel, the inventive principles also apply to the use of local power optimizers with substrings in systems that utilize DC power distribution rather without local inverters. For example, referring to FIG. 6, rather than connecting the three combined outputs $V_{OUT}1\pm$, $V_{OUT2}\pm$ and $V_{OUT3}\pm$ of the converters to a local inverter, they may be connected to a DC collector bus that collects power from numerous PV panels, each having a power processing architecture the same as or similar to that shown in FIG. 6. The DC collector bus may then feed a centralized inverter.

The inventive principles of this patent disclosure have been described above with reference to some specific example embodiments, but these embodiments can be modified in arrangement and detail without departing from the inventive concepts. Such changes and modifications are considered to fall within the scope of the following claims.

The invention claimed is:

1. A method for converting power from a photovoltaic (PV) panel having substrings of PV cells, the method comprising:
   converting power from a first substring of the PV panel to generate a first DC output having a fixed portion in series with a variable portion;
   converting power from a second substring of the PV panel to generate a second DC output having a fixed portion in series with a variable portion; and
   combining the first and second DC outputs to generate a combined DC output.

2. The method of claim 1 further comprising:
   tracking a maximum power point of the first substring by changing the variable portion of the first DC output; and
   tracking a maximum power point of the second substring by changing the variable portion of the second DC output.

3. The method of claim 1 wherein:
   the fixed portion of the first DC output is generated by a first open-loop DC-DC converter; and
   the variable portion of the first DC output is generated by a first closed-loop DC-DC converter.

4. The method of claim 1 further comprising converting the combined DC output to an AC output.

5. The method of claim 4 wherein converting the combined DC output to an AC output includes regulating the combined DC output.

6. The method of claim 5 wherein the combined DC output comprises a DC link voltage.

7. A system comprising:
   a first power converter having an input to receive power from a first substring of photovoltaic (PV) cells in a PV panel, and an output; and
   a second power converter having an input to receive power from a second substring of PV cells in the PV panel, and an output that is combined with the output of the first power converter;
   wherein the first and second power converters each have an unregulated power path with an output in series with an output of a regulated power path.

8. The system of claim 7 wherein the outputs of the first and second power converters are coupled in parallel.

9. The system of claim 7 wherein the unregulated power path and the regulated power path in each of the first and second power converters employ open-loop and closed-loop control, respectively.

10. The system of claim 7 wherein the first and second substrings of PV cells are connected in series.

11. The system of claim 7 wherein the unregulated power path and the regulated power path in each of the first and second power converters transfer power to an energy storage device.

12. The system of claim 11 wherein the energy storage device comprises a DC link capacitor.

13. The system of claim 11 further comprising an inverter coupled to the energy storage device.

14. The system of claim 7 wherein each of the first and second power converters includes maximum power point tracking (MPPT) functionality to track a maximum power point of the corresponding first and second substrings of the PV cells.

15. The system of claim 7 wherein each of the first and second power converters further comprises a controller to implement a feedforward loop for regulating the input of the corresponding first and second power converters.

16. The system of claim 7 wherein each of the first and second power converters is integrated into the PV panel.

17. The system of claim 7 wherein the unregulated power path and the regulated power path in each of the first and second power converters have a common input stage.

18. The system of claim 7 further comprising
   a third power converter having an input to receive power from a third substring of PV cells in the PV panel, and an output that is combined with the output of the first and second power converters;
   wherein the third power converter has an unregulated power path with an output in series with an output of a regulated power path.

19. A power converter comprising:
   an open-loop switching stage to receive DC power;
   a transformer having a primary winding coupled to the open-loop switching stage, and first and second secondary windings sharing a common core with the primary winding;
   a first rectifier bridge coupled to the first secondary winding configured to generate a fixed output;
   a second rectifier bridge coupled to the second secondary winding; and
   a regulator coupled to the second rectifier bridge configured to generate a variable output in series with the fixed output.

20. The power converter of claim 19 further comprising a controller configured to control the open-loop switching stage and the regulator.

21. The power converter of claim 19 wherein the fixed and variable outputs are combined into a final output.

22. The power converter of claim 19 wherein the regulator regulates an input to the open-loop switching stage.

23. The power converter of claim 19 further comprising a controller configured to implement a feedforward loop for regulating an input thereof.

24. The power converter of claim 19 wherein:
   the open-loop switching stage comprises an H-bridge; and
   the regulator comprises a boost converter.

* * * * *